(12) United States Patent
Yamada et al.

(10) Patent No.: US 11,887,905 B2
(45) Date of Patent: Jan. 30, 2024

(54) SEMICONDUCTOR DEVICE

(71) Applicant: DENSO CORPORATION, Kariya (JP)

(72) Inventors: Susumu Yamada, Kariya (JP); Shoichiro Omae, Kariya (JP); Takuo Nagase, Kariya (JP)

(73) Assignee: DENSO CORPORATION, Kariya (JP)

( * ) Notice: Subject to any disclaimer, the term of this patent is extended or adjusted under 35 U.S.C. 154(b) by 331 days.

(21) Appl. No.: 17/469,017

(22) Filed: Sep. 8, 2021

(65) Prior Publication Data

US 2021/0407876 A1 Dec. 30, 2021

Related U.S. Application Data

(63) Continuation of application No. PCT/JP2020/005568, filed on Feb. 13, 2020.

(30) Foreign Application Priority Data

Mar. 11, 2019 (JP) ................. 2019-043888

(51) Int. Cl.
| | | |
|---|---|---|
| *H01L 23/31* | (2006.01) | |
| *H01L 23/495* | (2006.01) | |
| *H01L 23/00* | (2006.01) | |
| *H01L 25/18* | (2023.01) | |
| *H01L 23/36* | (2006.01) | |

(52) U.S. Cl.
CPC .... *H01L 23/3107* (2013.01); *H01L 23/49517* (2013.01); *H01L 23/49537* (2013.01); *H01L 23/49562* (2013.01); *H01L 24/40* (2013.01); *H01L 25/18* (2013.01); *H01L 23/36* (2013.01);

(Continued)

(58) Field of Classification Search
CPC .......... H01L 23/3107; H01L 23/49517; H01L 24/40; H01L 23/49537; H01L 23/49562; H01L 23/051; H01L 23/49575; H01L 23/48; H01L 25/18
See application file for complete search history.

(56) References Cited

U.S. PATENT DOCUMENTS 10,720,383 B2 * 7/2020 Hiramitsu ......... H01L 23/49513
10,777,488 B2 * 9/2020 Tsuchimochi .... H01L 23/49562
(Continued)

FOREIGN PATENT DOCUMENTS

| JP | 2015-018943 A | 1/2015 |
|---|---|---|
| JP | 2015-082614 A | 4/2015 |

*Primary Examiner* — Bac H Au
(74) *Attorney, Agent, or Firm* — POSZ LAW GROUP, PLC

(57) ABSTRACT

The semiconductor device includes a semiconductor element having first and second main electrodes, first and second substrates connected to the first and second main electrodes, respectively, first and second main terminals connected to the first and second main electrodes via the first and second substrates, respectively, and a bonding member. The bonding member is interposed between the first and second main electrodes and between the first and second substrates, respectively. At least one of the first and second main terminals includes a plurality of terminals. The first and second main terminals are alternately arranged in one direction orthogonal to the thickness direction of the semiconductor element. The first and second main terminals are directly bonded to the first and second substrates without the bonding member.

5 Claims, 8 Drawing Sheets

(52) U.S. Cl.
CPC .............. *H01L 2924/1305* (2013.01); *H01L 2924/13091* (2013.01); *H01L 2924/181* (2013.01)

(56) References Cited

U.S. PATENT DOCUMENTS

| | | | |
|---|---|---|---|
| 10,811,345 B2* | 10/2020 | Muto | H01L 23/3107 |
| 11,270,984 B2* | 3/2022 | Arai | H01L 23/49562 |
| 11,380,656 B2* | 7/2022 | Ishino | H01L 23/49562 |
| 2005/0231925 A1* | 10/2005 | Fukuda | H01L 21/565 |
| | | | 257/E23.044 |
| 2012/0001308 A1* | 1/2012 | Fukutani | H01L 24/73 |
| | | | 438/123 |
| 2013/0181228 A1* | 7/2013 | Usui | H01L 23/49575 |
| | | | 257/E21.705 |
| 2013/0267064 A1 | 10/2013 | Ikeda et al. | |
| 2021/0143088 A1* | 5/2021 | Kamiya | H01L 23/4334 |
| 2021/0407875 A1* | 12/2021 | Miwa | H01L 23/48 |
| 2021/0407881 A1* | 12/2021 | Omae | H01L 24/40 |

\* cited by examiner

SEMICONDUCTOR DEVICE

CROSS REFERENCE TO RELATED APPLICATION

The present application is a continuation application of International Patent Application No. PCT/JP2020/005568 filed on Feb. 13, 2020, which designated the U.S. and claims the benefit of priority from Japanese Patent Application No. 2019-043888 filed on Mar. 11, 2019. The entire disclosures of all of the above applications are incorporated herein by reference.

TECHNICAL FIELD

The present disclosure relates to relates to a semiconductor device.

BACKGROUND

A conceivable semiconductor device includes a semiconductor element having a first main electrode and a second main electrode, a heat sink arranged so as to sandwich the semiconductor element, and a main terminal.

The heat sink includes a first heat sink electrically connected to the first main electrode and a second heat sink electrically connected to the second main electrode. The main terminal includes a first main terminal electrically connected to the first heat sink and a second main terminal electrically connected to the second heat sink.

The semiconductor device has one first main terminal and one second main terminal as main terminals. It is required to further reduce the inductance.

The main terminal is connected to the heat sink, for example, via a bonding member. There is also a need to improve the connection reliability of the main terminals.

SUMMARY

A semiconductor device may include a semiconductor element having first and second main electrodes, first and second substrates connected to the first and second main electrodes, respectively, first and second main terminals connected to the first and second main electrodes via the first and second substrates, respectively, and a bonding member. The bonding member is interposed between the first and second main electrodes and between the first and second substrates, respectively. At least one of the first and second main terminals includes a plurality of terminals. The first and second main terminals are alternately arranged in one direction orthogonal to the thickness direction of the semiconductor element. The first and second main terminals are directly bonded to the first and second substrates without the bonding member.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
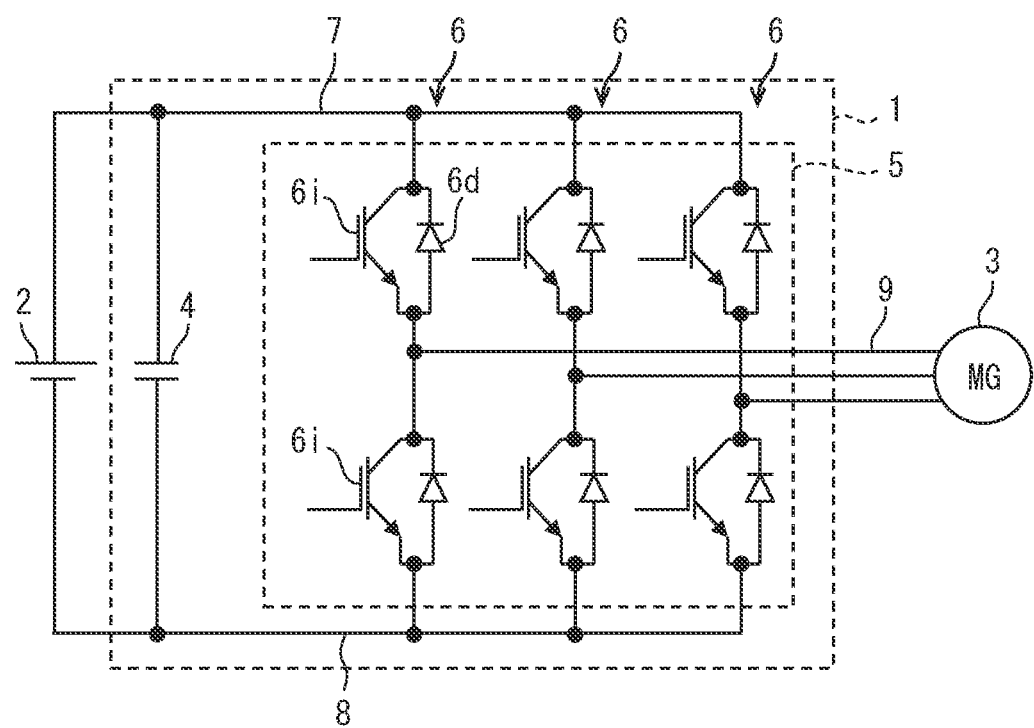
FIG. 1 is a diagram showing a schematic configuration of an electric power conversion device to which a semiconductor device according to a first embodiment is applied.

A semiconductor device is provided to be capable of improving the connection reliability of main terminals while reducing the inductance.

According to an aspect of the present embodiments, the semiconductor device includes: at least one semiconductor element having a first main electrode arranged on one side and a second main electrode arranged on the back side opposite to the one side in the thickness direction; a substrate arranged so as to sandwich the semiconductor element and having a first substrate arranged on the one side and electrically connected to the first main electrode, and a second substrate arranged on the back side and electrically connected to the second main electrode; a main terminal having a first main terminal electrically connected to the first main electrode via the first substrate, and a second main terminal electrically connected to the second main electrode; and a bonding member. The bonding member is interposed between the first main electrode and the first substrate, and between the second main electrode and the second substrate, respectively. At least one of the first main terminal and the second main terminal in the main terminal includes a plurality of main terminals. The first main terminal and the second main terminal are alternately arranged so that their side surfaces face each other in one direction orthogonal to the thickness direction of the semiconductor element. The first main terminal is directly bonded to the first substrate without using the bonding member. The second main terminal is directly bonded to the second substrate without using the bonding member.

According to the disclosed semiconductor device, the first main terminal and the second main terminal are alternately arranged so that the side surfaces thereof face each other. The semiconductor device has a plurality of pairs of side surfaces facing each other of the first main terminal and the second main terminal. Thereby, it may be possible to reduce the inductance.

For example, when the terminal arrangement area is constant, the proportion of the gap between the terminals increases as the number of main terminals increases in order to reduce the inductance. As a result, the energized region of the main terminal becomes small, and heat generation of the main terminal causes a difficulty. According to the disclosed semiconductor device, the main terminal is directly bonded to the corresponding substrate. Since no bonding member is used, it is possible to improve the connection reliability of the main terminals while reducing the inductance.

Hereinafter, multiple embodiments will be described with reference to the drawings. In the embodiments, functionally and/or structurally corresponding parts are denoted by the same reference numerals. In the following description, a thickness direction of a semiconductor element is given as a Z direction and a direction orthogonal to the Z direction is given as an X direction. A direction orthogonal to both of the Z direction and the X direction is shown as a Y direction. Unless otherwise specified, a shape along an XY plane defined by the X direction and the Y direction is a planar shape.

First Embodiment

First, an electric power conversion device including a semiconductor device will be described with reference to FIG. 1.

<Outline Configuration of Power Converter>

An electric power conversion device 1 shown in FIG. 1 is mounted on, for example, an electric vehicle or a hybrid vehicle. The electric power conversion device 1 performs electric power conversion between the DC power supply 2 and the motor generator 3.

The direct current power source 2 is a secondary battery capable of charging and discharging such as a lithium ion battery or a nickel hydrogen battery. The motor generator 3 is a three-phase AC type rotating electric machine. The motor generator 3 functions as a vehicle driving power source, that is, an electric motor. The motor generator 3 functions also as a generator during regeneration.

The electric power conversion device 1 includes a smoothing capacitor 4 and an inverter 5 as a power converter. A positive electrode terminal of the smoothing capacitor 4 is connected to a positive electrode of the DC power source 2, which is a high potential side electrode of the DC power source 2. A negative electrode terminal of the smoothing capacitor 4 is connected to a negative electrode of the DC power source 2, which is a low potential side electrode of the DC power source 2. The inverter 5 converts the input DC power into a three-phase AC having a predetermined frequency, and outputs the three-phase AC to the motor generator 3. The inverter 5 converts the AC power generated by the motor generator 3 into a DC power. The inverter 5 is a DC-AC converter.

The inverter 5 includes upper-lower arm circuits 6 for three phases. In the upper-lower arm circuit 6 of each phase, two arms are connected in series between a high potential power source line 7 and a low potential power source line 8. The high potential power source line 7 is a power source line on a positive electrode side, and the low potential power source line 8 is a power source line on a negative electrode side. In the upper-lower arm circuit 6 of each phase, a connection point between the upper arm and the lower arm is connected to an output line 9 to the motor generator 3.

In this embodiment, an n-channel type insulated gate bipolar transistor 6i (hereinafter referred to as an IGBT 6i) is adopted as a switching element constituting each arm. FWDs 6d as freewheel diodes are connected in reverse parallel to the IGBTs 30, respectively. The upper and lower arm circuits 6 for one phase are configured to have two IGBTs 6i. In the upper arm, collector electrodes of the IGBTs 30 are electrically connected to the high potential power source line 7. In the lower arm, emitter electrodes of the IGBTs 30 are electrically connected to the low potential power source line 8. The emitter electrodes of the IGBTs 6i in the upper arm and the collector electrodes of the IGBTs 6i in the lower arm are connected to each other.

In addition to the smoothing capacitor 4 and the inverter 5 described above, the power conversion device 1 may include a converter which is a power converter different from the inverter 5, a drive circuit for the switching element constituting the inverter 5 and the converter, and the like. The converter is a DC-DC converter that converts a DC voltage into anther DC voltage having a different value.

<Semiconductor Device>

Figure 2:
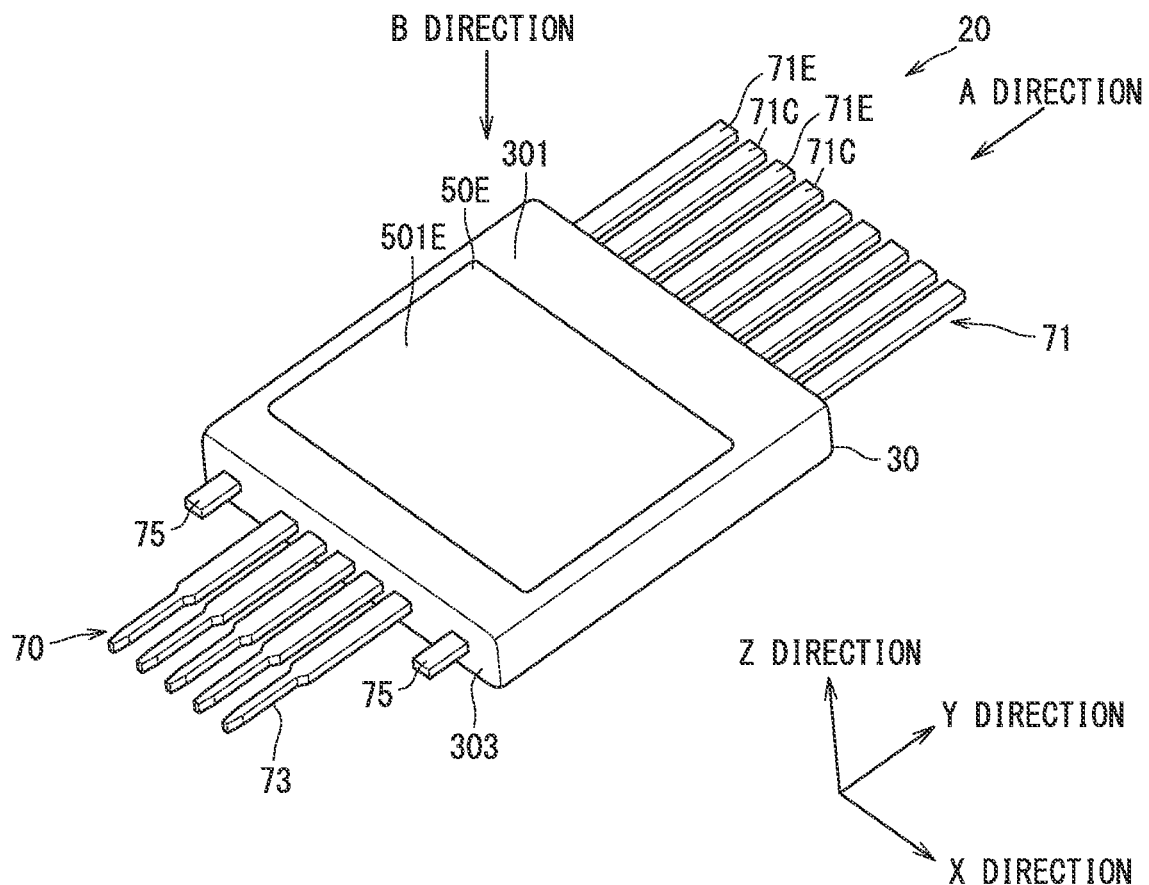
FIG. 2 is a perspective view showing the semiconductor device.
Figure 3:
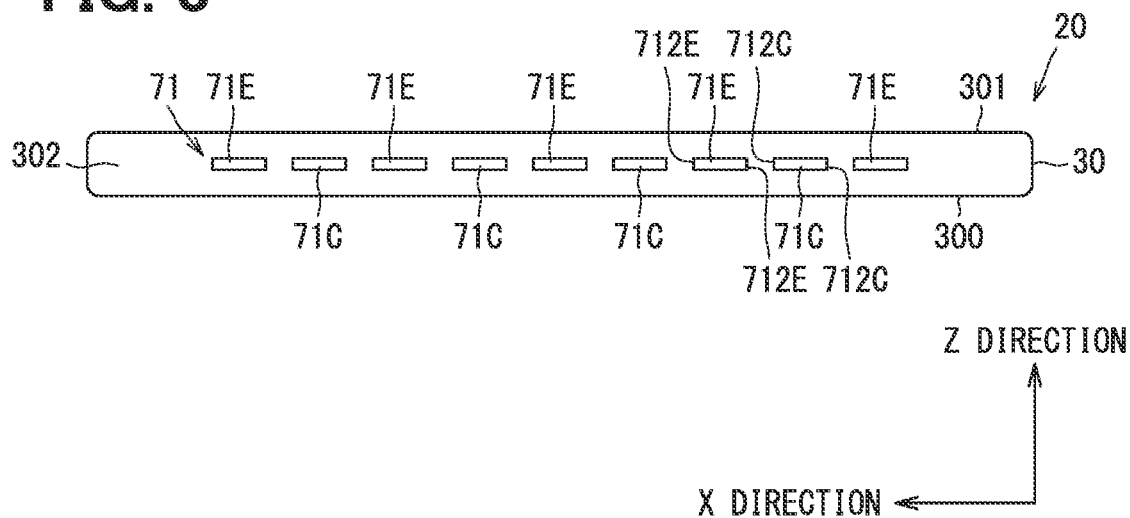
FIG. 3 is a plan view when the drawing of FIG. 2 is viewed from an A direction.
Figure 4:
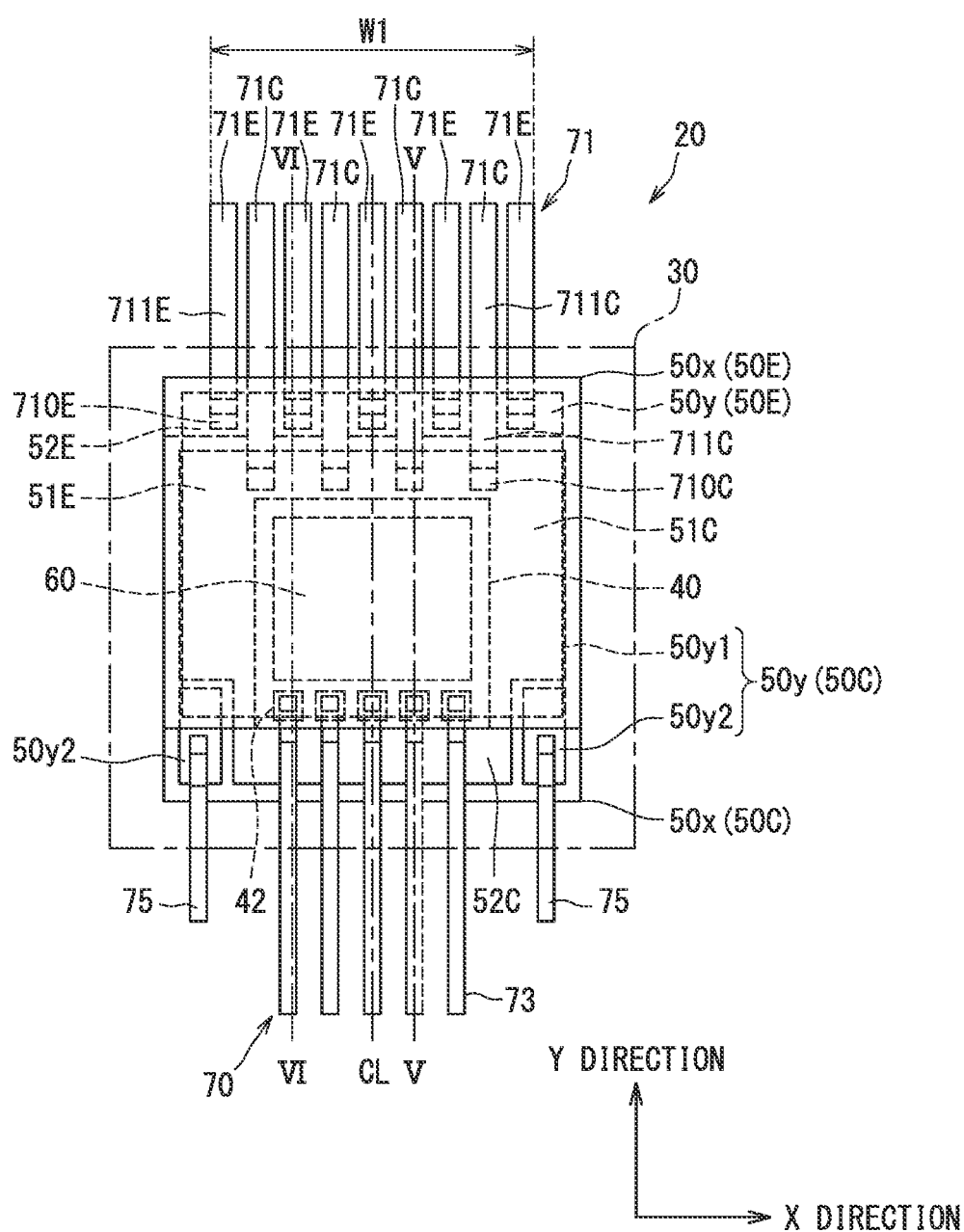
FIG. 4 is a plan view when the drawing of FIG. 2 is viewed from a B direction.

As shown in FIGS. 2 to 6, the semiconductor device 20 includes a sealing resin body 30, a semiconductor element 40, a substrate 50, a terminal 60, a lead frame 70 including a main terminal 71 and a signal terminal 73, and a bonding member 80. FIG. 3 is a plan view when viewing from a direction A in FIG. 2. FIG. 4 is a plan view of FIG. 2 when viewing from the B direction, and for convenience, the sealing resin body 30 is shown by a alternate long and short dash line.

The sealing resin body 30 seals a part of other elements constituting the semiconductor device 20. The rest of the other elements are exposed to the outside of the sealing resin body 30. The sealing resin body 30 seals, for example, the semiconductor element 40. The sealing resin body 30 seals a connecting portion formed between other elements constituting the semiconductor device 20. For example, the sealing resin body 30 seals the connection portion between the semiconductor element 40 and the substrate 50. The sealing resin body 30 seals the connection portion between the semiconductor element 40 and the terminal 60. The sealing resin body 30 seals the connection portion between the terminal 60 and the substrate 50. The sealing resin body 30 seals the connection portion between the substrate 50 and the main terminal 71. The sealing resin body 30 may be referred to as a mold resin.

The sealing resin body 30 is made of, for example, an epoxy resin. The sealing resin body 30 is formed by, for example, a transfer molding method. As shown in FIGS. 2 to 3, the sealing resin body 30 has one surface 300 and a rear surface 301 opposite to the one surface 300 in the Z direction. The one surface 300 and the rear surface 301 are, for example, flat surfaces. The sealing resin body 30 has a lateral surface connecting the one surface 300 and the rear surface 301. As shown in FIGS. 2 and 4, the sealing resin body 30 of the present embodiment has a substantially rectangular shape in a plane. The sealing resin body 30 has a side surface 302 on which the main terminal 71 protrudes to the outside and a side surface 303 on which the signal terminal 73 protrudes to the outside. The side surface 303 is a surface opposite to the side surface 302 in the Y direction.

In the semiconductor element 40, the element is formed on a semiconductor substrate such as Si, SiC, or GaN. The semiconductor device 20 includes at least one semiconductor element 40. In the present embodiment, the above-mentioned IGBT 6i and FWD 6d are formed on the semiconductor substrate constituting the semiconductor element 40. As described above, RC (Reverse Conducting) IGBT is adopted as the semiconductor element 40. The semiconductor element 40 constitutes one of the above-mentioned arms. The semiconductor element 40 is sometimes referred to as a semiconductor chip.

Figure 5:
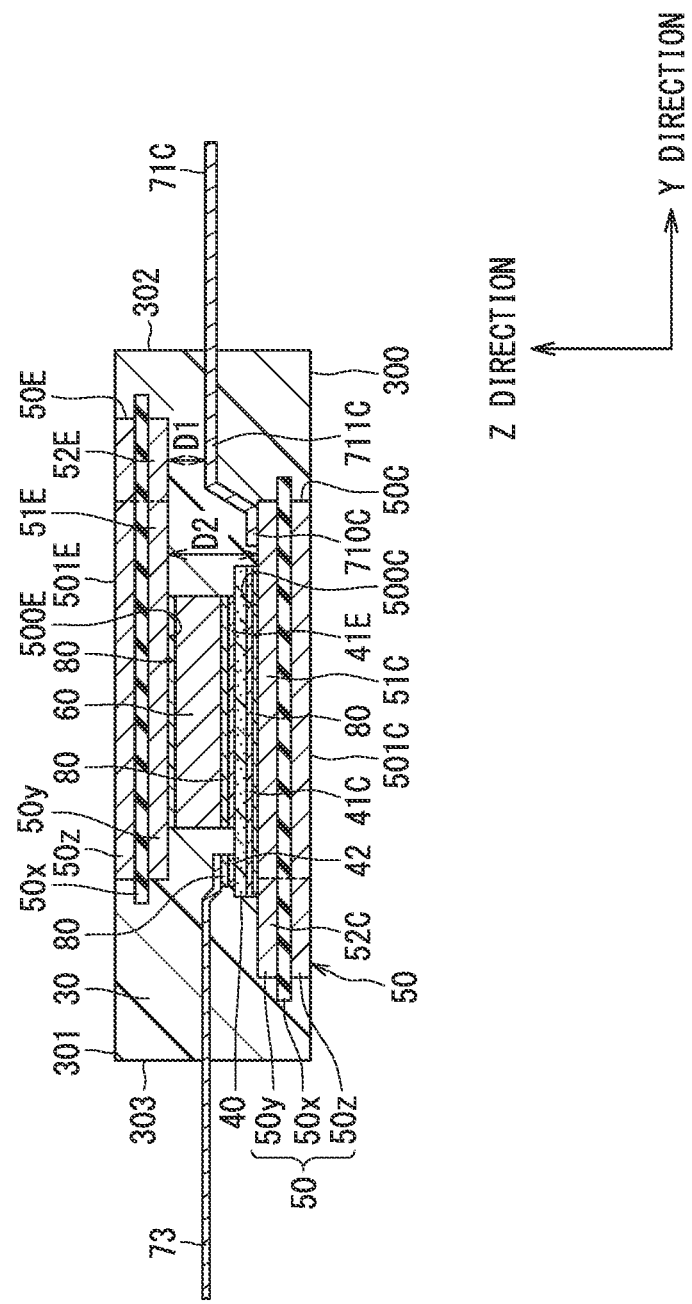
FIG. 5 is a cross-sectional view taken along a line V-V in FIG. 4.
Figure 6:
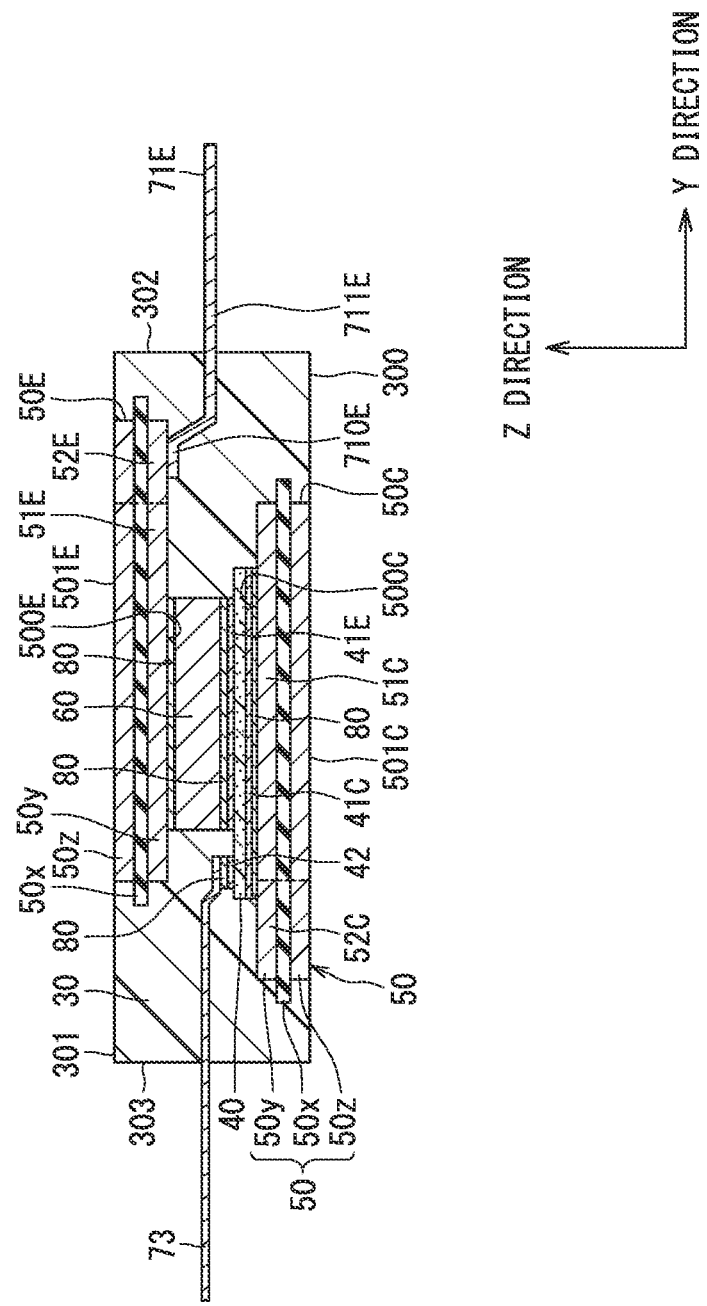
FIG. 6 is a cross-sectional view taken along a line VI-VI in FIG. 4.

The semiconductor element 40 has a vertical structure so that the main current flows in the Z direction. Although not shown, the semiconductor element 40 has a gate electrode. The gate electrode has, for example, a trench structure. As shown in FIGS. 5 and 6, the semiconductor element 40 has main electrodes on both sides thereof in the thickness direction, that is, in the Z direction. Specifically, as the main electrode, the collector electrode 41C is provided on one surface side, and the emitter electrode 41E is provided on the back surface side, which is the opposite surface to the one surface side. In the present embodiment, the collector electrode 41C also serves as the cathode electrode of the FWD 6d. The emitter electrode 41E also serves as an anode electrode of the FWD 6d. The collector electrode 41C is formed on almost the entire surface of the one side. The emitter electrode 41E is formed on a part of the back surface. The collector electrode 41C corresponds to a first main electrode, and the emitter electrode 41E corresponds to a second main electrode.

As shown in FIGS. 4 to 6, the semiconductor element 40 has a pad 42, which is an electrode for signals, on the forming surface of the emitter electrode 41E. The pad 42 is formed at a position different from that of the emitter electrode 41E. The pad 42 is electrically isolated from the emitter electrode 41E. The semiconductor element 40 has a substantially rectangular shape in a plane. The pad 42 is formed at an end on the side opposite to the formation region of the emitter electrode 42E in the Y direction.

The semiconductor element 40 has, for example, five pads 42. Specifically, the pad 42 has a gate electrode pad, a potential detection pad of the emitter electrode 41E, a current sense pad, and a temperature detection pad of the semiconductor element 40. The pad 42 for temperature detection includes an anode potential pad of a temperature sensing diode, which is a temperature detecting element, and a cathode potential pad. The five pads 42 are formed side by side in the X direction.

In the semiconductor element 40, for example, an Al-based material can be used as the constituent material of the electrodes such as the collector electrode 41C, the emitter electrode 41E, and the pad 42. When bonding by solder or the like, it may be preferable to include Cu as a material. For example, AlCuSi can be used.

The substrate 50 is arranged so as to sandwich the semiconductor element 40 in the Z direction. The substrate 50 functions as a wiring that electrically connects the semiconductor element 40 and the main terminal 71. The board 50 constitutes the main circuit of the inverter 5. Therefore, the substrate 50 may be referred to as a wiring board or a circuit board. The substrate 50 includes at least a metal material and functions to discharge heat generated by the semiconductor element 40. Therefore, the substrate 50 may be referred to as a heat sink or a heat radiating substrate.

The substrates 50 are provided in pairs so as to sandwich the semiconductor element 40. The semiconductor device 20 has a substrate 50C arranged on the collector electrode 41C side and a substrate 50E arranged on the emitter electrode 41E side as a pair of substrates 50. The substrate 50C corresponds to the first substrate, and the substrate 50E corresponds to the second substrate.

The substrates 50C and 50E are provided so as to accommodate the semiconductor element 40 inside in a plan view from the Z direction. The substrate 50C has a mounting surface 500C on the semiconductor element 40 side and a heat radiation surface 501C opposite to the mounting surface 500C in the Z direction. The substrate 50E has a mounting surface 500E on the semiconductor element 40 side and a heat radiation surface 501E opposite to the mounting surface 500E in the Z direction. The mounting surfaces 500C and 500E face each other in the Z direction. The mounting surfaces 500C and 500E are substantially parallel to each other. The mounting surface 500C corresponds to the surface on the second substrate side. The mounting surface 500E corresponds to the surface on the first substrate side.

In the present embodiment, the substrate 50 has opposing portions 51C and 51E in which the substrates 50C and 50E face each other in the Z direction, and non-opposing portions 52C and 52E in which the substrates 50C and 50E do not face each other. The substrate 50C has an opposing portion 51C facing the substrate 50E in the Z direction and a non-opposing portion 52C connected to the opposing portion 51C and not facing the substrate 50E in the Z direction. The substrate 50E has an opposing portion 51E facing the substrate 50C in the Z direction and a non-opposing portion 52E connected to the opposing portion 51E and not facing the substrate 50C in the Z direction. In FIGS. 5 and 6, the boundaries between the opposing portions 51C and 51E and the non-opposing portions 52C and 52E are indicated by a broken line.

The substrates 50C and 50E have a substantially rectangular shape in a plane. The substrates 50C and 50E have substantially the same shape and size as each other. As shown in FIG. 4, the substrates 50C and 50E substantially coincide with each other in the X direction. The substrates 50C and 50E are arranged so as to be shifted from each other in the Y direction. In the Y direction, the opposing portions 51C and 51E are arranged between the non-opposing portion 52C and the non-opposing portion 52E. In the Y direction, the non-opposing portion 52C is arranged on the signal terminal 73 side, and the non-opposing portion 52E is arranged on the main terminal 71 side so as to sandwich the central opposing portions 51C and 51E.

A collector electrode 41C is connected to the mounting surface 500C of the substrate 50C via a bonding member 80. The collector electrode 41C is connected to at least the opposing portion 51C. A terminal 60 is connected to the mounting surface 500E of the substrate 50E via a bonding member 80. An emitter electrode 41E is connected to a surface of the terminal 60 opposite to the mounting surface 500E via a bonding member 80. Corresponding main terminals 71 are also connected to the mounting surfaces 500C and 500E, as will be described later.

The terminal 60 functions as a wiring for electrically connecting the emitter electrode 41E and the substrate 50E. The terminal 60 functions to radiate the heat generated by the semiconductor element 40. The terminal 60 is formed by using a material having excellent conductivity and thermal conductivity, for example, Cu. The terminal 60 is provided so as to substantially coincide with the emitter electrode 41E in a plan view in the Z direction. The terminal 60 has a substantially rectangular parallelepiped shape. The terminal 60 is connected to the opposing portion 51E of the substrate 50E.

At least a part of each of the substrates 50C and 50E is sealed by the sealing resin body 30. In this embodiment, the heat radiation surface 501C of the substrate 50C is exposed from the sealing resin body 30. The heat radiation surface 501C is substantially arranged on the same plane flush with the surface 300. The portion of the surface of the substrate 50C other than the connection portion with the collector electrode 41C, the heat radiation surface 501C, and the connection portion with the corresponding main terminal 71C is covered with the sealing resin body 30. Similarly, the heat radiation surface 501E of the substrate 50E is exposed from the sealing resin body 30. The heat radiation surface 501E is substantially arranged on the same plane with the back surface 301. The portion of the surface of the substrate 50E other than the connection portion with the terminal 60, the heat radiation surface 501E, and the connection portion with the corresponding main terminal 71E is covered with the sealing resin body 30.

As the substrate 50, for example, a metal plate, a composite material of an electric insulator such as resin or ceramics and a metal body can be adopted. As a composite material, for example, there is a DBC (Direct Bonded Copper) substrate. The same type of materials may be used for the substrate 50C and the substrate 50E, or different materials may be used. In this embodiment, as shown in FIGS. 4 to 6, DBC substrates are used as the substrates 50C and 50E.

The substrate 50 has an insulator 50x and metal bodies 50y and 50z arranged so as to sandwich the insulator 50x. The insulator 50x is a ceramic substrate. The metal bodies 50y and 50z are formed by material including, for example, Cu. The metal bodies 50y and 50z are directly bonded to the insulator 50x. The substrate 50 is stacked in the order of the metal body 50y, the insulator 50x, and the metal body 50z from the semiconductor element 40 side. The substrate 50 has a three-layer structure.

The planar shapes and sizes of the metal bodies 50y and 50z are substantially the same as each other. The planar shape of the insulator 50x, which is the intermediate layer, is similar to that of the metal bodies 50y and 50z. The size of the insulator 50c is larger than that of the metal bodies 50y and 50z. The insulator 50x extends to the outside of the metal bodies 50y and 50z all around. In the substrates 50C and 50E, one surface of the metal body 50y forms a mounting surface 500C and 500E. In the substrates 50C and 50E, one surface of the metal body 50z forms a heat radiation surface 501C and 501E. When a composite material is used as the substrate 50, the opposing portions 51C and 51E and the non-opposing portions 52C and 52E of the substrate 50 are strictly defined by the metal bodies forming the mounting surfaces 500C and 500E.

In the present embodiment, the metal body 50y of the substrate 50C has a main portion 50y1 and a land 50y2. The main portion 50y1 occupies most of the metal body 50y. The collector electrode 41C is connected to the main portion 50y1. The land 50y2 is provided corresponding to the suspension lead 75 described later. The main portion 50y1 and the land 50y2 are electrically separated. Lands 50y2 are provided at two of the four corners of the metal body 50y having a substantially rectangular shape on the signal terminal 73 side. Most of the main portion 50y1 is provided on the opposing portion 51C, and a part thereof is provided on the non-opposing portion 52C. The land 50y2 is provided on the non-opposing portion 52C.

The lead frame 70 has a main terminal 71 and a signal terminal 73 as external connection terminals. The lead frame 70 is configured as a separate member from the substrate 50. The lead frame 70 is formed by processing a metal plate made of Cu or the like by a press or the like.

The main terminal 71 is an external connection terminal through which the main current flows. The lead frame 70 is provided with a plurality of main terminals 71. The main terminal 71 is electrically connected to the corresponding main electrode of the semiconductor element 40. The semiconductor device 20 has, as the main terminals 71, a main terminal 71C electrically connected to the collector electrode 41 and a main terminal 71E electrically connected to the emitter electrode 41. The main terminal 71C corresponds to a first main terminal, and the main terminal 71E corresponds to a second main terminal. The main terminal 71C may be referred to as a collector terminal. The main terminal 71E may be referred to as an emitter terminal.

The main terminal 71 is connected to the corresponding substrate 50. In the main terminal 71, the connection portion with the substrate 50 is sealed by the sealing resin body 30. Each of the main terminals 71 extends from the connection portion with the substrate 50 in the Y direction toward the direction away from the semiconductor element 40. All the main terminals 71 project outward from the side surface 302 of the sealing resin body 30. The main terminal 71C has a substantially constant width and extends in the Y direction in a plan view from the Z direction. The main terminal 71E also has a substantially constant width and extends in the Y direction in a plan view from the Z direction. The widths of the main terminals 71C and 71E are substantially equal to each other. The main terminal 71C extends substantially parallel to the current paths of the main terminal 71E and the substrate 50E.

As shown in FIGS. 4 and 5, the main terminal 71C has a connection portion 710C and an extending portion 711C. The connection portion 710C is a connection portion of the main terminal 71C to the substrate 50C. The connection portion 710C is directly bonded to the substrate 50C by ultrasonic bonding, friction stir welding, laser welding or the like. The connection portion 710C is directly bonded to the substrate 50C without the bonding member 80. The extension portion 711C is a portion extending from the connection portion 710C. The extension portion 711C is integrally connected to the connection portion 710C.

In this embodiment, the main terminal 71C is directly connected to the metal body 50y of the substrate 50C by ultrasonic bonding. The connection portion 710C of the main terminal 71C is connected to the opposing portion 51C of the substrate 50C. The extension portion 711C faces the mounting surface 500E of the substrate 50E at a position closer to the substrate 50E than the connection portion 710C. The main terminal 71C bridges the non-opposing portion 52E in the Y direction. The extension portion 711C approaches the substrate 50E in the Z direction and extends away from the semiconductor element 40 in the Y direction.

The extension portion 711C has a bent portion. The extension portion 711C protrudes from the sealing resin body 30 at a position closer to the mounting surface 500E than the connection portion 710C in the Z direction. The main terminal 71C has a crank shape in the YZ plane, and includes a portion extending substantially parallel to the mounting surface 500E on the non-opposing portion 52E. As shown in FIG. 5, the facing distance D1 between the parallel portion of the extending portion 711C and the non-opposing portion 52E is shorter than the facing distance D2 between the mounting surfaces 500C and 500E of the substrates 50C and 50E.

As shown in FIGS. 4 and 6, the main terminal 71E has a connection portion 710E and an extending portion 711E. The connection portion 710E is a connection portion of the main terminal 71E to the substrate 50E. The connection portion 710E is also directly joined to the substrate 50E without using the bonding member 80. The extension portion 711E is a portion extending from the connection portion 710E. The extension portion 711E is integrally connected to the connection portion 710E.

In this embodiment, the main terminal 71E is directly connected to the metal body 50y of the substrate 50E by ultrasonic bonding. The connection portion 710E of the main terminal 71E is connected to the non-opposing portion 52E of the substrate 50E. The extension portion 711E extends in the direction away from the semiconductor element 40 in the Y direction. The extension portion 711E also has a bent portion. The extension portion 711E protrudes from the sealing resin body 30 at a position closer to the mounting surface 500E than the connection portion 710E in the Z direction. The main terminal 71E has a crank shape in the YZ plane.

The main terminals 71C and 71E are arranged side by side in one direction orthogonal to the Z direction. The main terminals 71C and 71E are arranged so that the side surfaces 712C and 712E face each other. In the main terminals 71C and 71E, the extension portions 711C and 711E face each other. The lead frame 70 has a plurality of at least one of the main terminals 71C and 71E.

The main terminals 71C and 71E are arranged alternately in the arrangement direction. Alternate means that the main terminals 71C and the main terminals 71E are adjacent to each other in the arrangement direction. The main terminals 71C and 71E do not face each other on the plate surfaces, but the side surfaces 712C and 712E face each other. Due to the alternating arrangement, the lead frame 70 has a plurality of sets of facing side surfaces 712C and 712E. At least a part of the side surfaces 712C and 712E may face each other in the plate thickness direction of the main terminal 71. For example, the side surfaces may be placed so as to shift in the plate thickness direction. Preferably, one of the side surfaces 712C and 712E facing each other is arranged to face the other one over the entire area in the thickness direction.

The minimum alternating configuration is a configuration including a total of three main terminals 71. For example, in the case of two main terminals 71C and one main terminal 71E, the main terminal 71C, the main terminal 71E, and the main terminal 71C are arranged in the arrangement direction. Two sets of side surfaces 712C and 712E facing each other are formed. In this embodiment, the lead frame 70 has four main terminals 71C and five main terminals 71E. The plurality of main terminals 71C have substantially the same structure as each other. The plurality of main terminals 71E have substantially the same structure as each other.

The main terminals 71C and 71E are arranged alternately in the X direction. The main terminals 71E are arranged at both ends in the arrangement direction. The main terminals 71C and 71E are arranged at substantially the same positions in the Z direction on the protruding tip side of the main terminal 71E from the bent portion. The side surfaces 712C and 712E face each other. As shown in FIG. 3, the lead frame 70 has eight sets of side surfaces 712C and 712E facing each other. The facing distance between the side surfaces 712C and 712E, in other words, the pitch with the main terminals 71C and 71E is almost constant.

As shown in FIG. 4, the main terminals 71C and 71E are arranged line-symmetrically with respect to the center line CL passing through the element center of the semiconductor element 40 in the X direction. The element center is the center of the semiconductor element 40 when there is one semiconductor element 40 as in the present embodiment. When there are two semiconductor elements 40, for example, it is the central position between the centers in the alignment direction of the two semiconductor elements 40. The center line CL is a virtual line orthogonal to the X direction and passing through the element center.

The signal terminal 73 is electrically connected to the pad 42 of the corresponding semiconductor element 40. The lead frame 70 has a plurality of signal terminals 73. The signal terminal 73 is connected to the pad 42 inside the sealing resin body 30. The five signal terminals 73 connected to the pads 42 extend in the Y direction and away from the semiconductor element 40, respectively. The signal terminals 73 are arranged in the X direction. All the signal terminals 73 project outward from the side surface 302 of the sealing resin body 30.

In this embodiment, as shown in FIGS. 5 and 6, the signal terminal 73 is connected to the pad 42 via the bonding member 80. As the above-mentioned bonding member 80, a conductive paste including solder, Ag, or the like can be used. In this embodiment, solder is used as the bonding member 80.

The lead frame 70 has a suspension lead 75. The plurality of signal terminals 73 are supported by the suspension leads 75 via tie bars (not shown) in a state before the tie bar cut process. After molding the sealing resin body 30, unnecessary parts of the lead frame 70 including the tie bar are removed. Two suspension leads 75 are provided so as to sandwich the signal terminal 73 in the X direction. The suspension lead 75 extends in the Y direction. In the suspension lead 75, one end is connected to the land 50$y$2 described above, and a part including the other end protrudes from the side surface 303 of the sealing resin body 30. In the present embodiment, the suspension lead 75 is directly joined to the land 50$y$2 without the intervention of the bonding member 80. The suspension lead 75 is directly connected to the substrate 50C by ultrasonic bonding.

In the semiconductor device 20 configured as described above, the sealing resin body 30 integrally seals a part of each of the semiconductor element 40 and the substrate 50, a part of each of the terminal 60 and the main terminal 71, and a part of the signal terminal 73. That is, elements configuring one arm are sealed. Such a semiconductor device 20 may be referred to as a one-in-one package.

Further, the heat radiation surface 501C of the substrate 50C is substantially arranged on the same plane with one surface 300 of the sealing resin body 30. The heat radiation surface 501E of the substrate 50E is substantially arranged on the same plane with the back surface 301 of the sealing resin body 30. The semiconductor device 20 has a double-sided heat radiation structure in which the heat radiation surfaces 501C and 501E are both exposed from the sealing resin body 30. The semiconductor device 20 can be formed, for example, by cutting the substrate 50 together with the sealing resin body 30. Further, the sealing resin body 30 may be molded with the heat radiation surfaces 501C and 501E in contact with the cavity wall surface of the mold for molding the sealing resin body 30.

<Manufacturing Method of Semiconductor Devices>

An example of the manufacturing method of the semiconductor device 20 described above will be described with reference to FIGS. 7 and 8.

Figure 7:
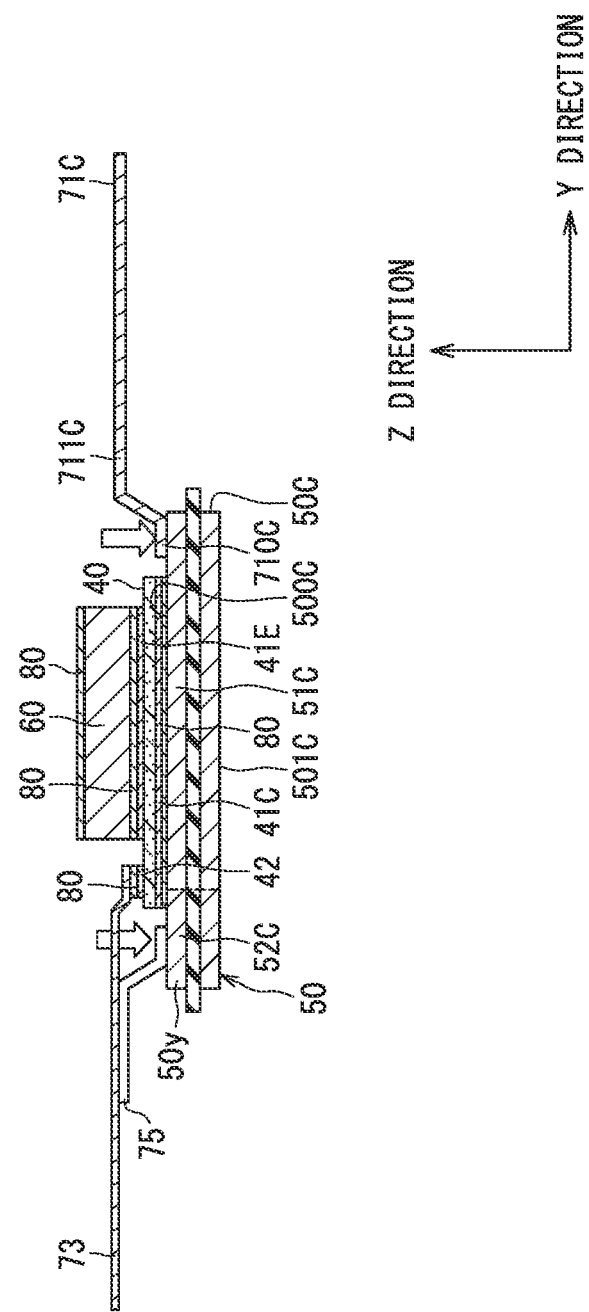
FIG. 7 is a cross-sectional view showing a manufacturing method.

First, the stacking body shown in FIG. 7 is formed. This is the state before the substrate 50E is connected to the stacking body. As shown in FIG. 7, the semiconductor element 40 is arranged on the mounting surface 500C of the substrate 50C via the bonding member 80. Further, the terminal 60 is arranged on the emitter electrode 41E of the semiconductor element 40 via the bonding member 80. The bonding member 80 is arranged on the surface of the terminal 60 on the substrate 50E side. For example, the terminal 60 may be arranged on the emitter electrode 41E with the bonding members 80 preliminary provided on both sides of the terminal 60. Further, a connecting portion of the signal terminal 73 is arranged on the pad 42 via the bonding member 80. In this arrangement state, a connecting portion via the bonding member 80 is formed by heating or the like. When solder is used as the bonding member 80, a solder joint is formed by performing solder reflow process.

After forming the connecting portion, the main terminal 71C and the suspension lead 75 are connected to the substrate 50C. In this embodiment, the connection portion 710C of the main terminal 71C is directly bonded to the mounting surface 500C on the opposing portion 51C of the substrate 50C by ultrasonic bonding. Further, one end of the suspension lead 75 is directly bonded to the land 50$y$2 of the substrate 50C by ultrasonic bonding. As a result, a stacking body is formed.

Figure 8:
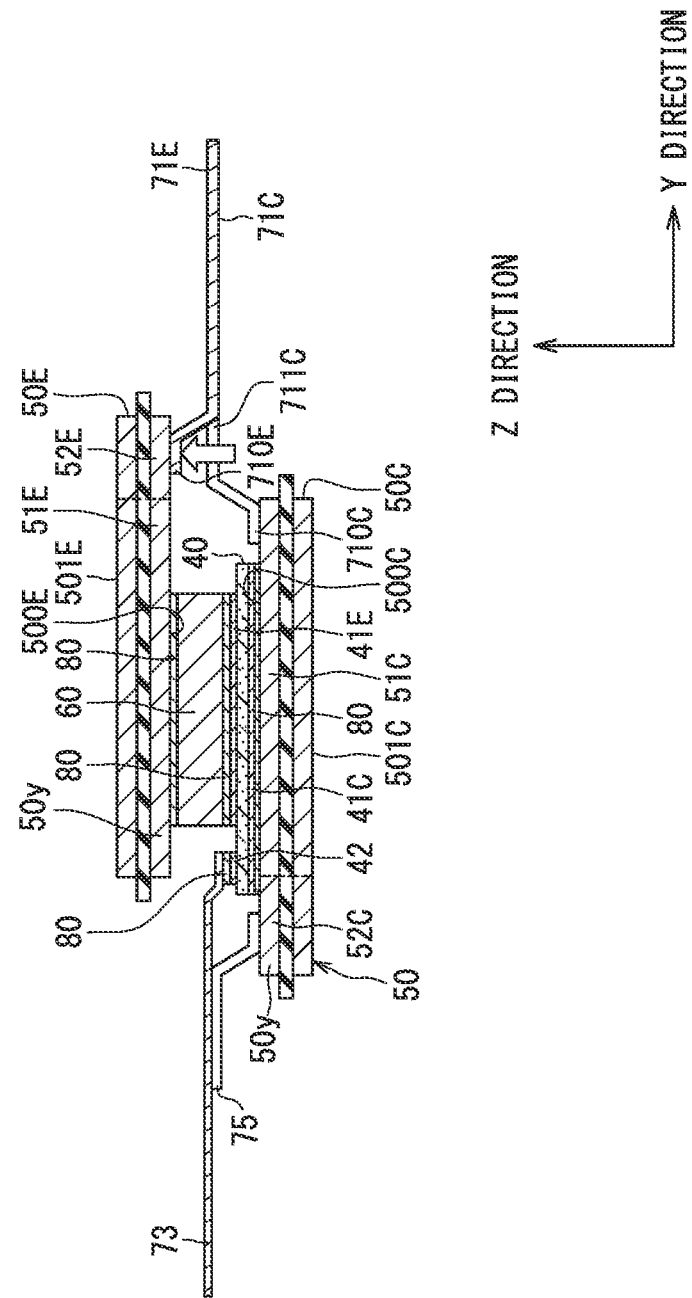
FIG. 8 is a cross-sectional view showing a manufacturing method.

Next, as shown in FIG. 8, the substrate 50E is arranged on the terminal 60. In this arrangement state, the substrate 50E and the terminal 60 are connected via the bonding member 80. When solder is used, the substrate 50E and the terminal 60 are connected by performing solder reflow process. After connecting the board 50E, the main terminal 71E is connected to the substrate 50E. In this embodiment, the connecting portion 710E of the main terminal 71E is directly bonded to the mounting surface 500E on the non-opposing portion 52E of the substrate 50C by ultrasonic bonding. Since the substrates 50C and 50E are arranged so as to be offset in the Y direction, the main terminal 71E can be directly bonded to the mounting surface 500E of the substrate 50E. The substrate 50E may be arranged so as to come into contact with the heat radiation surface 501E on a pedestal (not shown), and the main terminal 71E may be connected in this arranged state. For example, the substrate 50E may be arranged vertically below the substrate 50C, and the main terminal 71E may be connected.

Next, although not shown, the sealing resin body 30 is molded. Then, the semiconductor device 20 can be obtained by cutting an unnecessary portion of the lead frame 70 such as a tie bar.

SUMMARY OF FIRST EMBODIMENT

According to the semiconductor device 20 of the present embodiment, the main terminals 71C and 71E are arranged alternately. The side surfaces 712C and 712E of the adjacent main terminals 71C and 71E face each other. At the main terminals 71C and 71E, the directions of the main currents are substantially opposite. As a result, the magnetic fluxes generated when the main current flows cancel each other, and the inductance can be reduced. However, the side surface is smaller than the plate surface, which is the surface in the plate thickness direction. On the other hand, the lead frame 70 has three or more main terminals 71. As a result, the main terminals 71 have a plurality of sets of facing side surfaces 712C and 712E. Accordingly, it may be possible to effectively reduce the inductance. Further, a plurality of main terminals 71C and 71E of the same type are provided in parallel. This also makes it possible to reduce the inductance.

Figure 9:
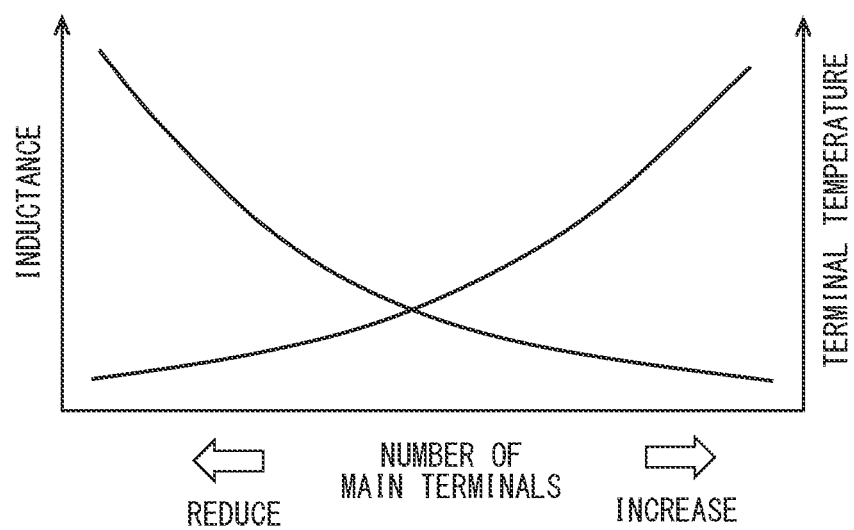
FIG. 9 is a diagram showing the relationship between the number of main terminals, inductance, and terminal temperature.

FIG. 9 is a diagram showing the relationship between the total number of main terminals, inductance, and terminal temperature. FIG. 9 shows simulation results such as magnetic field analysis. At that time, the width of the entire main terminal (defined as a width W1 shown in FIG. 4) is kept constant. As shown in FIG. 9, it is obvious that the inductance can be reduced as the number of main terminals 71 increases, that is, as the number of pairs of facing side surfaces 712C and 712E increases. In this embodiment, it has four main terminals 71C and five main terminals 71E. Accordingly, it may be possible to effectively reduce the inductance. Thereby, for example, the surge voltage generated by the switching of the IGBT 6i can be reduced.

For example, in the configuration in which all the main terminals 71 are drawn out from the side surface 302 of the sealing resin body 30 as in the present embodiment, the terminal width W1 is restricted by the width of the side surface 302, more specifically, the width of the substrate 50. When the width W1 of the entire main terminal is constant, as the number of main terminals 71 increases, the ratio of the gap between the main terminals 71 with respect to the width W1 increases. The cross-sectional area of each of the main terminals 71 becomes smaller, and the energized region becomes smaller at the main terminals 71 having the same potential. Therefore, for example, it becomes difficult for a DC current to flow. Therefore, as shown in FIG. 6, as the number of main terminals 71 increases, the temperature of the main terminals 71 rises. The DC current is a current (i.e., direct current) that flows in a steady state when the semiconductor element (i.e., the switching element) turns on. On the other hand, in the present embodiment, the main terminals 71C and 71E are directly joined to the corresponding substrates 50C and 50E without using a bonding member 80 such as solder. Since the metals are bonded to each other and the bonding member 80 such as solder is not used, the connection reliability of the main terminal 71 to the substrate 50 can be improved. For example, the occurrence of electromigration can be suppressed.

From the above, it is possible to provide the semiconductor device 20 capable of improving the connection reliability of the main terminal 71 while reducing the inductance.

Further, in the present embodiment, the substrates 50C and 50E are arranged in a shifted manner. As a result, the substrate 50E has the non-opposing portion 52E. Therefore, the main terminal 71E of the lead frame 70 can be directly bonded to the mounting surface 500E of the non-opposing portion 52E. While adopting the lead frame structure, both the main terminals 71C and 71E can be directly bonded to the mounting surfaces 500C and 500E of the corresponding substrates 50C and 50E.

The reduction in inductance is also realized by the facing arrangement of the substrates 50C and 50E. However, the semiconductor element 40 and the terminal 60 are interposed between the substrates 50C and 50E. On the other hand, in the present embodiment, the extension portion 711C of the main terminal 71C is arranged to face the substrate 50E at a position closer to the substrate 50E (i.e., the mounting surface 500E) than the connection portion 710C. As a result, the extension portion 711C of the main terminal 71C becomes the closest as a portion having the same potential as the collector electrode 41C facing the substrate 50E. Therefore, the effect of reducing the inductance can be enhanced. Since a plurality of such main terminals 71C are provided, the effect of reducing the inductance can be further enhanced.

In particular, in the present embodiment, the main terminal 71C straddles the non-opposing portion 52E of the substrate 50E in a plan view from the Z direction. The main terminal 71C crosses the non-opposing portion 52E in the Y direction. The extension portion 711C of the main terminal 71C is arranged to face the non-opposing portion 52C. Accordingly, it may be possible to effectively reduce the inductance.

In the present embodiment, the main terminals 71C and 71E are arranged line-symmetrically with respect to the center line CL of the semiconductor element 40 in the X direction. As a result, the main current flows so as to be line-symmetric with respect to the center line CL. The main current flows almost evenly on the left side and the right side with respect to the center line CL. Thereby, it may be possible to reduce the inductance. In addition, it may be possible to suppress local heat generation.

As the configuration of the main terminal 71, an example having four main terminals 71C and five main terminals 71E has been shown, but the present embodiment is not limited to this feature. The number of main terminals 71C may be larger than the number of main terminals 71E. For example, the number of main terminals 71C may be five and the number of main terminals 71E may be four. In this case, the main terminals 71C are arranged at both ends in the alignment direction. The total number of main terminals 71 is not limited to odd numbers. It may be an even number.

Although not shown, the signal terminal 73 may be electrically connected to the pad 42 of the semiconductor element 40 via a bonding wire. The thickness of the terminal 60 increases the height of the bonding wire.

An example is shown in which the semiconductor device 20 includes a terminal 60, but the present embodiment is not limited thereto. When the signal terminal 73 is connected to the pad 42 via the bonding member 80 as in the present embodiment, the terminal 60 may not be provided. According to this, since the facing distance D2 of the substrates 50C and 50E is shortened, the inductance can be further reduced. On the other hand, in a configuration in which the signal terminal 73 is connected to the pad 42 via the bonding member 80, the facing distance D2 of the substrates 50C and 50E may be adjusted to a predetermined value by using the terminal 60.

The connection position of the main terminal 71 with respect to the substrate 50 is not limited to the above example. For example, the main terminal 71 may be connected to the side surface of the corresponding substrate 50.

OTHER EMBODIMENTS

The disclosure in this specification and drawings etc. is not limited to the exemplified embodiment. The disclosure covers the illustrated embodiments and modifications made based on the illustrated embodiments by those skilled in the art. For example, the disclosure is not limited to the combinations of parts and/or elements shown in the embodiments. The disclosure may be implemented in various combinations. The disclosure may have additional parts that may be added to the embodiment. The disclosure covers omissions of parts and/or elements of the embodiments. The disclosure covers replacement or combination of components, elements between one embodiment and another. The disclosed technical scope is not limited to the description of the embodiments.

Although an example in which the semiconductor device 20 is applied to the inverter 5 has been described, the present embodiment is not limited to the above example. For example, the present embodiment may be applied to a converter. The present embodiment may also be applied to both the inverter 5 and the converter.

An example in which the IGBT 6*i* and the FWD 6*d* are formed on the semiconductor element 40 has been shown, but the present embodiment is not limited to this feature. The IGBT 6*i* and the FWD 6*d* constituting the same arm may be arranged on separate chips.

Although the examples of the IGBT 6*i* is shown as the switching element, the present embodiment is not limited to the above example. For example, a MOSFET can be employed.

An example is shown in which the heat radiation surfaces 501C and 501E are exposed from the sealing resin body 30, but the present embodiment is not limited to this feature. At least one of the heat radiation surfaces 501C and 501E may be covered with the sealing resin body 30. The heat radiating surfaces 501C and 501E may be covered with an insulating member (not shown) different from the sealing resin body 30.

An example in which the semiconductor device 20 includes the sealing resin body 30 is shown, but the present embodiment is not limited to this example.

Although the present disclosure has been described in accordance with the embodiments, it is understood that the present disclosure is not limited to such examples or structures. The present disclosure also encompasses various modifications and variations within an equivalent range. In addition, various combinations and forms, and further, other combinations and forms including only one element, or more or less than these elements are also within the sprit and the scope of the present disclosure.

What is claimed is:

1. A semiconductor device comprising:
   at least one semiconductor element having a first main electrode disposed on one surface side, and a second main electrode disposed on a back surface side opposite to the one surface side in a thickness direction;
   a substrate arranged to sandwich the semiconductor element and having a first substrate arranged on the one surface side and electrically connected to the first main electrode, and a second substrate arranged on the back surface side and electrically connected to the second main electrode;
   a main terminal including at least one first main terminal electrically connected to the first main electrode via the first substrate, and at least one second main terminal electrically connected to the second main electrode via the second substrate; and
   a bonding member, wherein:
   the bonding member is interposed between the first main electrode and the first substrate, and between the second main electrode and the second substrate, respectively;
   at least one of the first main terminal and the second main terminal in the main terminal includes a plurality of terminals;
   the first main terminal and the second main terminal are alternately arranged, and a side surface of the first main terminal and a side surface of the second main terminal face each other in a direction orthogonal to the thickness direction of the semiconductor element;
   the first main terminal is directly bonded to the second substrate without the bonding member and
   the second main terminal is directly bonded to the second substrate without the bonding member.

2. The semiconductor device according to claim 1, wherein:
   the substrate includes an opposing portion in which the first substrate and the second substrate face each other in the thickness direction, and a non-opposing portion connecting to the opposing portion of the second substrate and not facing the first substrate;
   the first main terminal is directly bonded to a surface of the first substrate on a second substrate side without the bonding member; and
   the second main terminal is directly bonded to a surface of the non-opposing portion of the second substrate on a first substrate side without the bonding member.

3. The semiconductor device according to claim 2, wherein:
   the first main terminal is directly bonded to the opposing portion of the first substrate; and
   the first main terminal includes a connection portion with the first substrate, and an extension portion extending from the connection portion and arranged to face the second substrate at a position closer to the second substrate than the connection portion.

4. The semiconductor device according to claim 3, wherein:
   the first main terminal bridges the non-opposing portion in a plan view from the thickness direction; and the extension portion is arranged to face at least the non-opposing portion of the second substrate.

5. The semiconductor device according to claim 1, further comprising:
- a sealing resin body that integrally seals at least a part of the semiconductor element, at least a part of the substrate, and a part of the main terminal, wherein:
- all of the main terminal protrudes from one surface of the sealing resin body to an outside of the sealing resin body.

* * * * *